(12) United States Patent
Guo et al.

(10) Patent No.: US 10,873,055 B2
(45) Date of Patent: Dec. 22, 2020

(54) DISPLAY PANEL HAVING LIGHT GUIDING MEDIUM STRUCTURE AND DISPLAY DEVICE

(71) Applicant: Shanghai Tianma Micro-Electronics Co., Ltd., Shanghai (CN)

(72) Inventors: Linshan Guo, Wuhan (CN); Zhonghuan Cao, Wuhan (CN); Jujian Fu, Shanghai (CN); Jiaxian Liu, Wuhan (CN)

(73) Assignee: Shanghai Tianma Micro-Electronics Co. Ltd., Shanghai (CN)

( * ) Notice: Subject to any disclaimer, the term of this patent is extended or adjusted under 35 U.S.C. 154(b) by 0 days.

(21) Appl. No.: 16/513,332

(22) Filed: Jul. 16, 2019

(65) Prior Publication Data

US 2020/0212360 A1 Jul. 2, 2020

(30) Foreign Application Priority Data

Dec. 26, 2018 (CN) .......................... 2018 1 1604273

(51) Int. Cl.
*H01L 51/52* (2006.01)
*H01L 27/32* (2006.01)

(52) U.S. Cl.
CPC ........ *H01L 51/5262* (2013.01); *H01L 27/322* (2013.01); *H01L 27/3246* (2013.01); *H01L 27/3272* (2013.01); *H01L 51/5218* (2013.01)

(58) Field of Classification Search
CPC ............. H01L 51/5262; H01L 51/5218; H01L 27/322; H01L 27/3246; H01L 27/3272

USPC .......................................................... 257/88
See application file for complete search history.

(56) References Cited

U.S. PATENT DOCUMENTS

| 10,325,967 | B2* | 6/2019 | Zeng | H05B 33/26 |
| 10,522,602 | B1* | 12/2019 | Ma | H01L 51/5284 |
| 2006/0232195 | A1* | 10/2006 | Cok | H01L 51/5268 313/504 |
| 2006/0250084 | A1* | 11/2006 | Cok | H01L 51/5253 313/512 |
| 2015/0187858 | A1* | 7/2015 | Wang | H01L 27/3279 257/40 |

FOREIGN PATENT DOCUMENTS

| CN | 106066729 A | 11/2016 |
| CN | 107665639 A | 2/2018 |

* cited by examiner

*Primary Examiner* — Andy Huynh
(74) *Attorney, Agent, or Firm* — von Briesen & Roper, s.c.

(57) ABSTRACT

Provided are a display panel and a display device. The display panel includes: a substrate and pixel units provided on the substrate, and the pixel units of at least two different colors are adjacently arranged. In a direction facing away from the substrate, one of the pixel units includes a reflective electrode, a light emitting unit and a color resist, and the light emitting unit and the color resist disposed in a same pixel unit have a same color, a vertical projection of a geometric center of the light emitting unit on the substrate is not overlapped with that of a geometric center of the color resist in the same pixel unit on the substrate. A vertical projection of the color resist in the pixel unit on the substrate is overlapped with that of the light emitting unit in a pixel unit closest to the pixel unit on the substrate.

13 Claims, 7 Drawing Sheets

US 10,873,055 B2

DISPLAY PANEL HAVING LIGHT GUIDING MEDIUM STRUCTURE AND DISPLAY DEVICE

CROSS-REFERENCE TO RELATED APPLICATIONS

This application claims priority to Chinese patent application No. 201811604273.1 filed on Dec. 26, 2018, the disclosure of which is incorporated herein by reference in its entirety.

TECHNICAL FIELD

The present disclosure relates to the field of display techniques, and, in particular, to a display panel and display device.

BACKGROUND

OLED (Organic Light Emitting Diode) display is a self-illuminating display, Compared with an LCD (Liquid Crystal Display), OLED display does not require a backlight, so OLED display is lighter and thinner. In addition, OLED displays are increasingly being used in a variety of high performance display fields due to their high brightness, low power consumption, wide viewing an high response speed, and wide operating temperature range, etc.

The top-emitting)LED display includes a reflective electrode, the reflective electrode has a high reflectivity and can reflect ambient light to the human eye. When a pixel unit does not emit light, the reflective electrode in the pixel unit reflects ambient light, causing the human eye to see the reflected light at the pixel unit, affecting the contrast of the display.

SUMMARY

The present disclosure provides a display panel and a display device to improve the contrast of the display panel and the display device, In a first aspect, an embodiment of the present disclosure provides a display panel, including: a substrate and pixel units provided on the substrate, where the pixel units of at least two different colors are adjacently arranged.

In a direction facing away from the substrate, one of the pixel units includes a reflective electrode, a light emitting unit and a color resist. The light emitting unit and the color resist disposed in a same pixel unit have a same color, and a vertical projection of a geometric center of the light emitting unit on the substrate is not overlapped with that of a geometric center of the color resist in the same pixel unit on the substrate.

A vertical projection of the color resist in the one of the pixel units on the substrate is overlapped with that of the light emitting unit in a pixel unit adjacent to the one of the pixel units on the substrate. The pixel unit further includes a light guiding medium structure disposed between the light emitting unit and the color resist, a gap between adjacent light guiding medium structures, and a refractive index of a filler in the gap smaller than that of the light guiding medium structure.

In a second aspect, an embodiment of the present disclosure provides a display device including the display panel described in the first aspect.

In the display panel provided by the embodiments of the present disclosure, a vertical projection of a geometric center of the light emitting unit on the substrate is not overlapped with that of a geometric center of the color resist in the same pixel unit on the substrate, and a vertical projection of the color resist in one pixel unit on the substrate is overlapped with that of the light emitting unit in a pixel unit adjacent to the pixel unit on the substrate. When the display panel is lightened to display, the light emitted from the light emitting unit in the same pixel unit is conducted to the color resist through the light guiding medium structure and then emitted outside the display panel without affecting the normal display. When ambient light is applied to the display panel, the ambient tight is filtered by color resists of two different colors, so that the ambient light cannot be emitted outside the display panel and cannot be seen by human eyes, thereby improving the contrast of the display panel.

DETAILED DESCRIPTION

Figure 1:
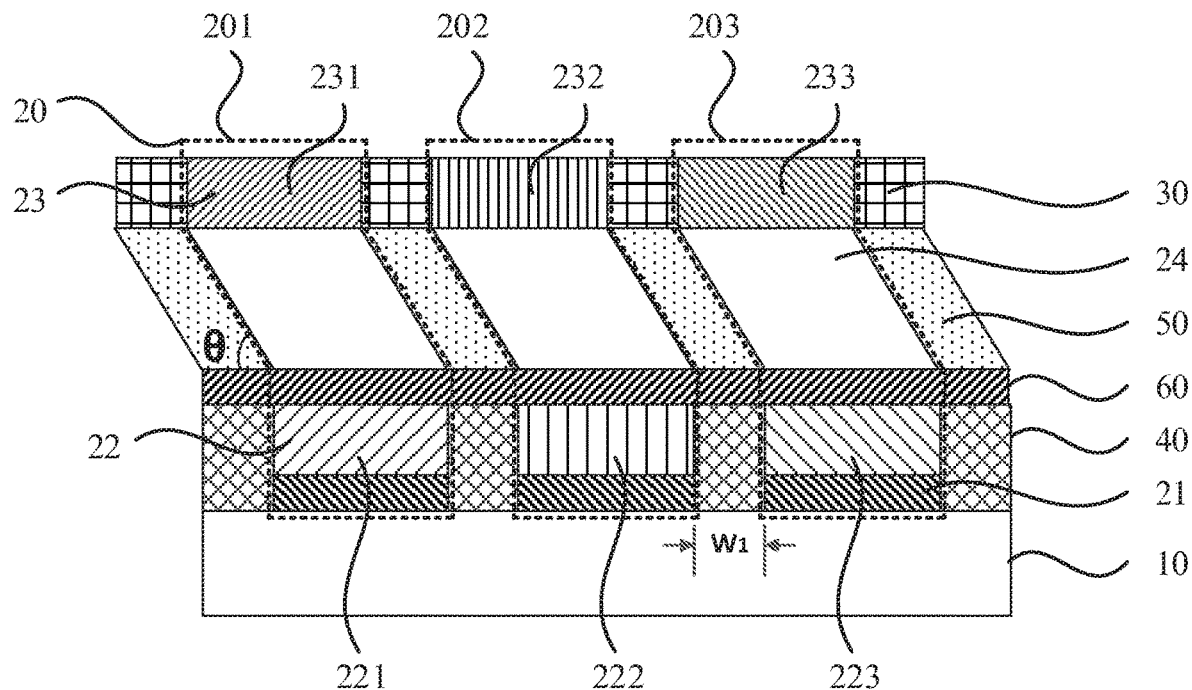
FIG. 1 is a structural diagram of a display panel according to an embodiment of the present disclosure.

Hereinafter the present disclosure will be further described in detail in conjunction with the drawings and embodiments. It should be understood that the specific embodiments set forth below are merely intended to illustrate and not to limit the present disclosure. Additionally, it should be noted that, for ease of description, only part, not all, of the structures related to the present disclosure are illustrated in the drawings.

FIG. 1 is a schematic structural diagram of a display panel according to an embodiment of the present disclosure. Referring to FIG. 1, the display panel includes a substrate 10 and pixel units 20 provided on the substrate 10, where the pixel units 20 of at least two different colors are adjacently arranged. In a direction facing away from the substrate 10, the pixel unit 20 includes a reflective electrode 21, a light emitting unit 22 and a color resist 23. The light emitting unit 22 and the color resist 23 disposed in the same pixel unit 20 have a same color, and a vertical projection of a geometric center of the light emitting unit 22 on the substrate 10 is not overlapped with that of a geometric center of the color resist 23 in the same pixel unit 20 on the substrate 10. That is, the light-emitting unit 22 and the color resist 23 in the same pixel unit 20 are staggered from each other. A vertical projections of the light emitting unit 22 in one of the pixel units 20 on the substrate 10 is overlapped with that of the color resist 23 in an adjacent pixel unit 20. The pixel unit 20 further includes a light guiding medium structure 24 disposed between the light emitting unit 22 and the color resist 23. A gap exists between adjacent light guiding medium structures 24, and a refractive index of the filler in the gap is smaller than that of the light guiding medium structure 24. The light guiding medium structure 24 and the filler in the gap together form a structure similar to an optical fiber. In such a way, when an incident angle of incident light exceeds a certain angle, the incident light can be propagated in the light guiding medium structure 24 due to total reflection. When the incident angle of incident light is less than or equal to the certain angular range, the incident light can be propagated into the filler from the light guiding medium structure 24 because no total reflection occurs.

Illustratively, referring to FIG. 1, the pixel units 20 of three different colors are illustrated in FIG. 1, and is not intended to limit the disclosure. The pixel units 20 of three different colors are a red pixel unit 201, a green pixel unit 202, and a blue pixel unit 203, respectively. A green pixel unit 202 and a blue pixel unit 203 are adjacent to the red pixel unit 201, a red pixel unit 201 and a blue pixel unit 203 are adjacent to the green pixel unit 202, and a red pixel unit 201 and a green pixel unit 202 are adjacent to the blue pixel unit 203. The red pixel unit 201 includes a red light emitting unit 221 and a red color resist 231 corresponding to the red light emitting unit 221, and the red color resist 231 is staggered from the red light emitting unit 221. The green pixel unit 202 includes a green light emitting unit 222 and a green color resist 232 corresponding to the green light emitting unit 222, and the green color resist 232 is staggered from the green light emitting unit 222. The blue pixel unit 203 includes a blue light emitting unit 223 and a blue color resist 233 corresponding to the blue light emitting unit 223, and the blue color resist 233 is staggered from the blue light emitting unit 223.

Figure 2:
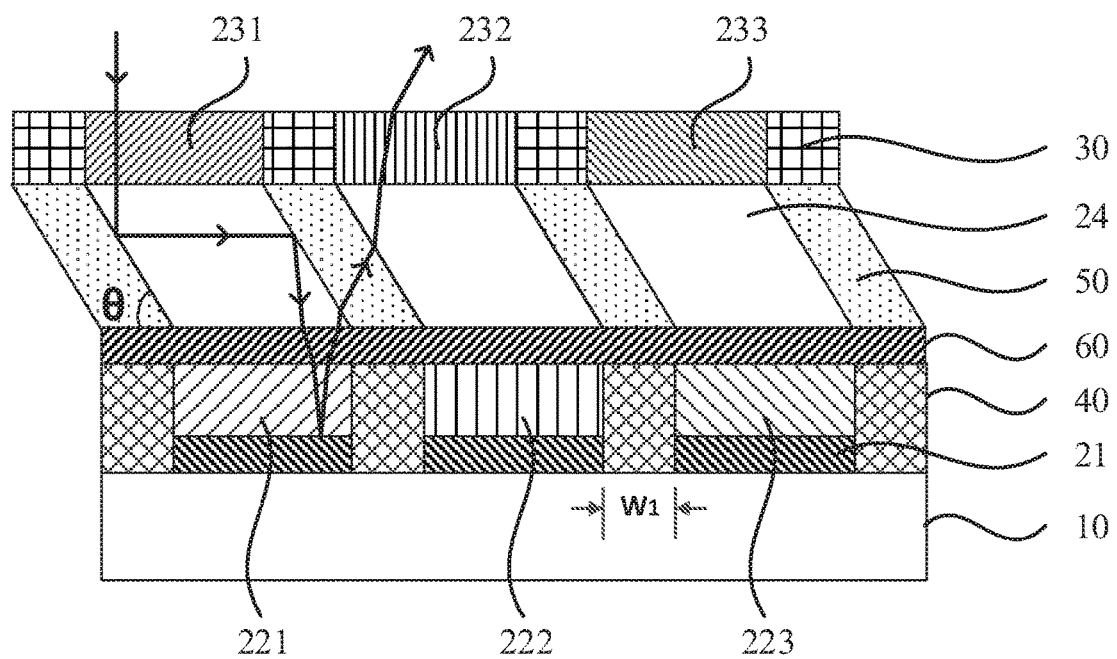
FIG. 2 is a schematic diagram showing that ambient light after being reflected by a reflective electrode of a pixel unit exits through a color resist of an adjacent pixel unit.

FIG. 2 is a schematic diagram showing that ambient light after being reflected by a reflective electrode of a pixel unit exits through a color resist of an adjacent pixel unit. Referring to FIG. 1 and FIG. 2, the ambient light is irradiated onto the red color resist 231, and the light passing through the red color resist 231 is conducted to the red light emitting unit 221 by the light guiding medium structure 24, and the light passing through the red light emitting unit 221 is reflected by the reflective electrode 21. Since the vertical projection of the geometric center of the red light-emitting unit 221 on the substrate 10 is not overlapped with that of the geometric center of the red color resist 231 on the substrate 10, and the vertical projection of the red color resist 231 on the substrate 10 is overlapped with that of the green color resist 232 on the substrate 10, the light reflected by the reflective electrode 21 is irradiated onto the green color resist 232. When the ambient light is irradiated onto the display panel, the ambient light first passes through the red color resist 231, and the spectrum of the ambient light filtered by the red color resist 231 does not coincide with the spectrum of the light that can be transmitted through the green color resist 232, consequently, the green color resist 232 can block the light reflected by the reflective electrode 21 from being emitted outside the display panel, and prevent the ambient light reflected by the reflective electrode 21 from being seen by human eyes, thereby improving the contrast of the display panel.

Figure 3:
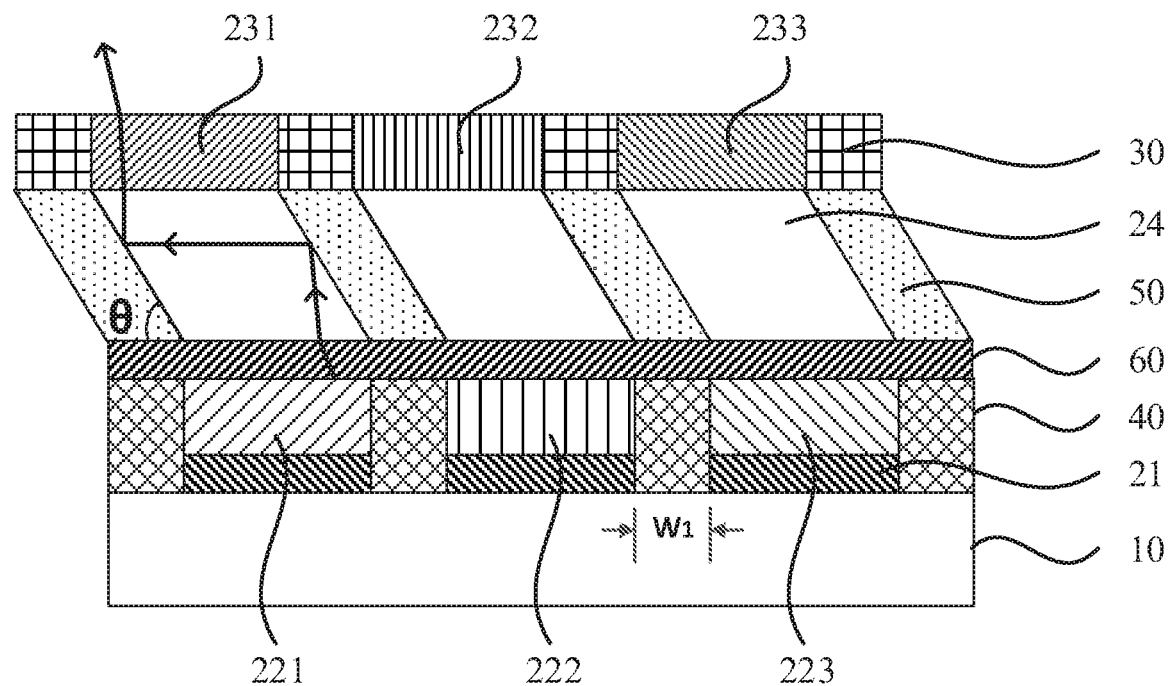
FIG. 3 is a schematic diagram showing light emitted from a pixel unit exiting through a color resist of the same pixel unit.

FIG. 3 is a schematic diagram showing light emitted from a pixel unit exiting through a color resist of the same pixel unit, Referring to FIG. 1 and FIG. 3, the light emitted from the red light emitting unit 221 is conducted to the red color resist 231 by the light guiding medium structure 24 Since the spectrum of the light emitted from the red light-emitting unit 221 coincides with the spectrum of light that can be transmitted through the red color resist 231, the light emitted from the red light emitting unit 221 can pass through the red color resist 231 and exit out of the display panel. Similarly, the light emitted by the green light-emitting unit 222 can pass through the green color resist 232 and emit outside the display panel, and the light emitted by the blue light-emitting unit 223 can pass through the blue color resist 233 and emit outside the display panel.

Optionally, the display panel may further include a counter electrode 60 disposed opposite to the reflective electrode 21. The light emitting unit 22 is disposed between the counter electrode 60 and the reflective electrode 21, and the light emitting unit 22 can emit light under the drive of the counter electrode 60 and the reflective electrode 21. Illustratively, the reflective electrode 21 is an anode and the counter electrode 60 is a cathode. Under the action of an applied electric field, electrons and holes are injected into the light-emitting unit 22 from the opposite electrode 60 and the reflective electrode 21, respectively, thereby undergoing migration, recombination, and attenuation in the light-emitting unit 22 to emit light.

In the display panel provided by the embodiments of the present disclosure, a vertical projection of a geometric center of the color resist on the substrate is not overlapped with that of a geometric center of the light-emitting unit in the same pixel unit, a vertical projection of the light emitting unit in one of the pixel units on the substrate is overlapped with that of the color resist in an adjacent pixel unit on the substrate. When the display panel is lightened to display, the light emitted from the light emitting unit in the same pixel unit is conducted to the color resist through the light guiding medium structure and then emitted outside the display panel without affecting the normal display. When ambient light is applied to the display panel, the ambient light is filtered by color resists of two different colors, so that the ambient light cannot be emitted outside the display panel and cannot be seen by human eyes, thereby improving the contrast of the display panel.

In one embodiment, referring to FIG. 1, a vertical projection of the first surface of the light guiding medium structure 24 on the substrate 10 is overlapped with that of a light emitting unit adjacent to the first surface of the light guiding medium structure 24 on the substrate 10. A vertical projection of the second surface of the light guiding medium structure 24 on the substrate 10 is overlapped with that of the color resist 23 adjacent to the second surface of the light guiding medium structure 24. The first surface of the light guiding medium structure 24 is the surface adjacent to the substrate 10, and the second surface of the light guiding medium structure 24 is the surface facing away from the substrate 10.

Illustratively, referring to FIG. 1, the red light emitting unit 221 is overlapped with the first surface of the light guiding medium structure 24 in the red pixel unit 201, and the red color resist 231 is overlapped with the second surface of the light guiding medium structure 24 in the red pixel unit 201. Therefore, the light emitted from the red light emitting unit 221 can pass through the red color resist 231 as much as possible and exit out of the display panel, thereby improving the brightness of the display panel. Illustratively, referring to FIG. 1, the red light emitting unit 222 is overlapped with the first surface of the light guiding medium structure 24 in the red pixel unit 202, and the red color resist 232 is overlapped with the second surface of the light guiding medium structure 24 in the red pixel unit 202. Therefore, the light emitted from the red light emitting unit 222 can pass through the red color resist 232 as much as possible and exit out of the display panel, thereby improving the brightness of the display panel. Illustratively, 110 referring to FIG. 1, the red light emitting unit 223 is overlapped with the first surface of the light guiding medium structure 24 in the red pixel unit 203, the red color resist 233 is overlapped with the second surface of the light guiding medium structure 24 in the red pixel unit 203, therefore, and light emitted from the red light emitting unit 223 can pass through the red color resist 233 as much as possible and exit out of the display panel, thereby improving the brightness of the display panel.

Optionally, with reference to FIG. 1, a black matrix 30 is disposed between adjacent two color resistors 23. A pixel defining layer 40 is disposed between adjacent light emitting units 22, The display panel further includes a plurality of light guiding interval structures 50 disposed between the pixel defining layer 40 and the black matrix 30. The light guiding interval structure 50 is disposed between the adjacent light guiding medium structures 24 and tills the gap. That is, the light guiding interval structure 50 is disposed between the adjacent light guiding medium structures 24, and the light guiding medium structure 24 is in contact with the light guiding interval structure 50. The refractive index of the each of the light guiding interval structures 50 is smaller than that of the light guiding medium structure 24. The light guiding medium structure 24 and the light guiding interval structure 50 together form a structure similar to an optical fiber. In such way, when an incident angle of incident light exceeds a certain angle, the incident light can be propagated in the light guiding medium structure 24 due to total reflection. When the incident angle of incident light is less than or equal to the certain angular range, the incident light can be propagated into the light guiding interval structure 50 from the light guiding medium structure 24 because no total reflection occurs.

In one embodiment, referring to FIG. 1, a vertical projection of a first surface of the light guiding interval structure 50 on the substrate 10 is overlapped with that of a pixel defining layer adjacent to the first surface of the light guiding interval structure 50 on the substrate 10. A vertical projection of the second surface of the light guiding interval structure 50 on the substrate 10 is overlapped with that of the black matrix 30 adjacent to the second surface of the light guiding interval structure 50 on the substrate 10. The first surface of the light guiding interval structure, 50 is the surface adjacent to the substrate 10, and the second surface of the light guiding interval structure 50 is the surface facing away from the substrate 10.

In other embodiments, the first surface of the light guiding medium structure 24 may not overlap with the light emitting unit 22, the second surface of the light guiding medium structure 24 may not overlap with the color resist 23, the first surface of the light guiding interval structure 50 may not overlap with the pixel defining layer 40, and the second surface of the light guiding spacer structure 50 may not overlap with the black matrix 30.

Optionally, referring to FIG. 1 and FIG. 2, the angle between an extending direction of the light guiding medium structure 24 and the substrate 10 is θ, which satisfies:

$$\sin^{-1}\frac{n_2}{n_1} \le \theta \le \frac{1}{3}\left(\sin^{-1}\frac{n_2}{n_1} + 180°\right).$$

Where $n_1$ denotes a refractive index of the light guiding medium structure 24 and $n_2$ denotes a refractive index of the light guiding interval structure 50. At this time, the light reflected by the reflective electrode 21 can be propagated into the light guiding interval structure 50 by the light guiding medium structure 24 because no total reflection occurs, so that most of the ambient light can be filtered by the color resist of two different colors. Therefore, the ambient light cannot be emitted outside the display panel and be seen by human eyes.

Figure 4:
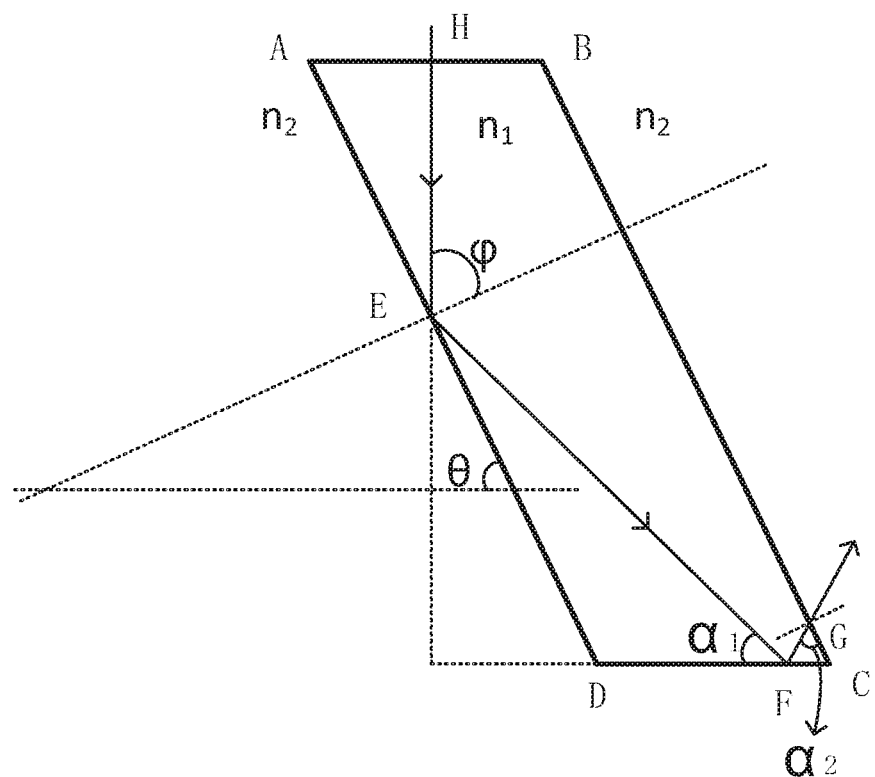
FIG. 4 is a simplified schematic view showing a reflection of the ambient light by a reflective electrode in FIG. 2.

FIG. 4 is a simplified schematic view showing a reflection of the ambient light by a reflective electrode in FIG. 2, Referring to FIG. 1, FIG. 2 and FIG. 4, since the thickness of the counter electrode 60 and the light emitting unit 22 is small, the simplified schematic diagram in FIG. 4 omits the counter electrode 60 and light emitting unit 22. For the sake of clarity, various points are also marked in FIG. 4. As can be seen from FIG. 4, $\phi=\theta=\angle GCF$, $\alpha_1=\angle GFC$, $\alpha_2=\angle CGF$, $\alpha_1=\theta-\angle DEF$ and $\angle DEF=\angle AEH=90°-\phi=90°-\theta$.

Thus, the following formula can be achieved.

$$\alpha_2=180°-\angle GFC-\angle GCF=180°-\alpha_1-\theta=180°-(\theta-\angle DEF)-\theta=180°-2\theta+(90°-\theta)=270°-3\theta.$$

When the light reflected by the reflective electrode 21 can be propagated from the light guiding medium structure 24 to the light guiding interval structure 50 due to no total reflection, it is required to satisfy: $n_1 \sin(90°-\alpha_2) < n_2 \sin(90°)$, and when the $\alpha_2$ is substituted into the above formula, the following formula can be achieved.

$$\sin^{-1}\frac{n_2}{n_1} \le \theta \le \frac{1}{3}\left(\sin^{-1}\frac{n_2}{n_1} + 180°\right).$$

Figure 5:
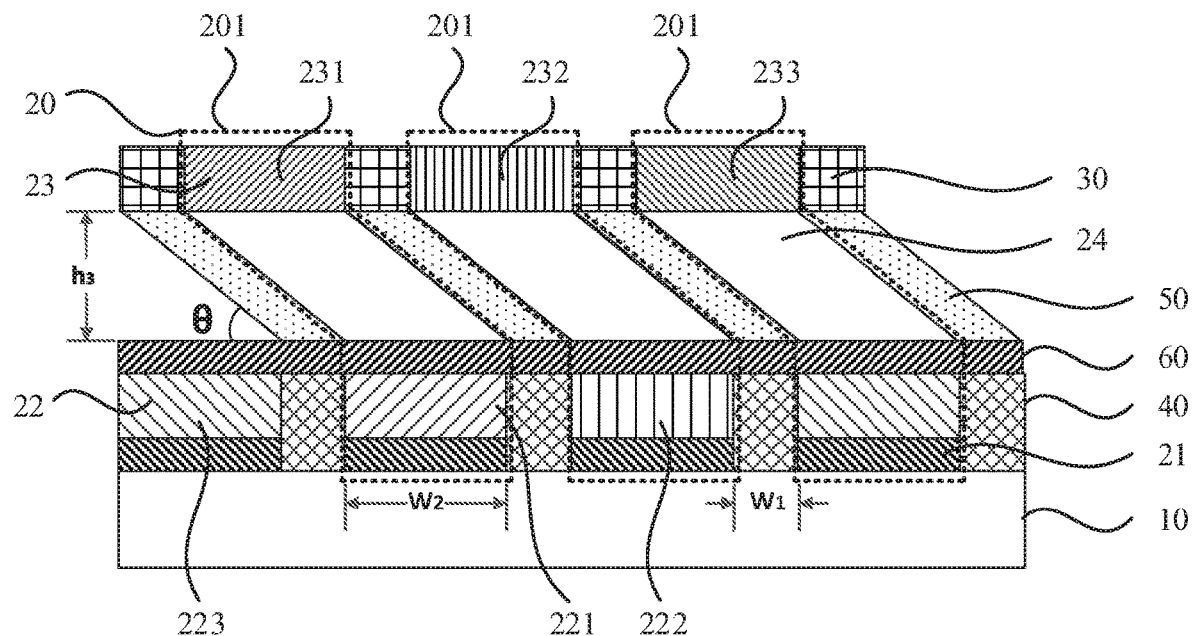
FIG. 5 is a structural diagram of another display panel according to an embodiment of the present disclosure.

FIG. 5 is a structural diagram of another display panel according to an embodiment of the present disclosure. Referring to FIG. 1 and FIG. 5, in a same pixel unit 20, a vertical projection of an edge of the light emitting unit 22 on the substrate 10 is overlapped with that of an edge of the color resist 23 on the substrate. That is, the light-emitting unit 22 and the color resist 23 in the same pixel unit 20 are just staggered, the vertical projection of the light-emitting unit 22 on the substrate 10 is not overlapped with that of the color resist 23 on the substrate 10 in the same pixel unit 20, and the vertical projection of the light-emitting unit 22 on the substrate 10 is adjacent to that of the color resist 23 on the substrate 10 in the same pixel unit 20. A vertical distance between a surface of light guiding medium structure 24 facing away from the substrate 10 and a surface of light guiding medium structure 24 adjacent to the substrate 10 is $h_3$, which satisfies $h_3=w_2 \cdot \tan\theta$. wherein $w_2$ denotes a width of the light emitting unit 22, and θ denotes the angle between the extending direction of the light guiding medium structure 24 and the substrate 10. Illustratively, a plurality of the light emitting units 22 of different colors are a red light emitting unit 221, a green light emitting unit 222, and a blue light emitting unit. 223, respectively. The widths of the red light emitting unit. 221, the green light emitting unit 222, and the blue light emitting unit 223 are all $w_2$.

Figure 6:
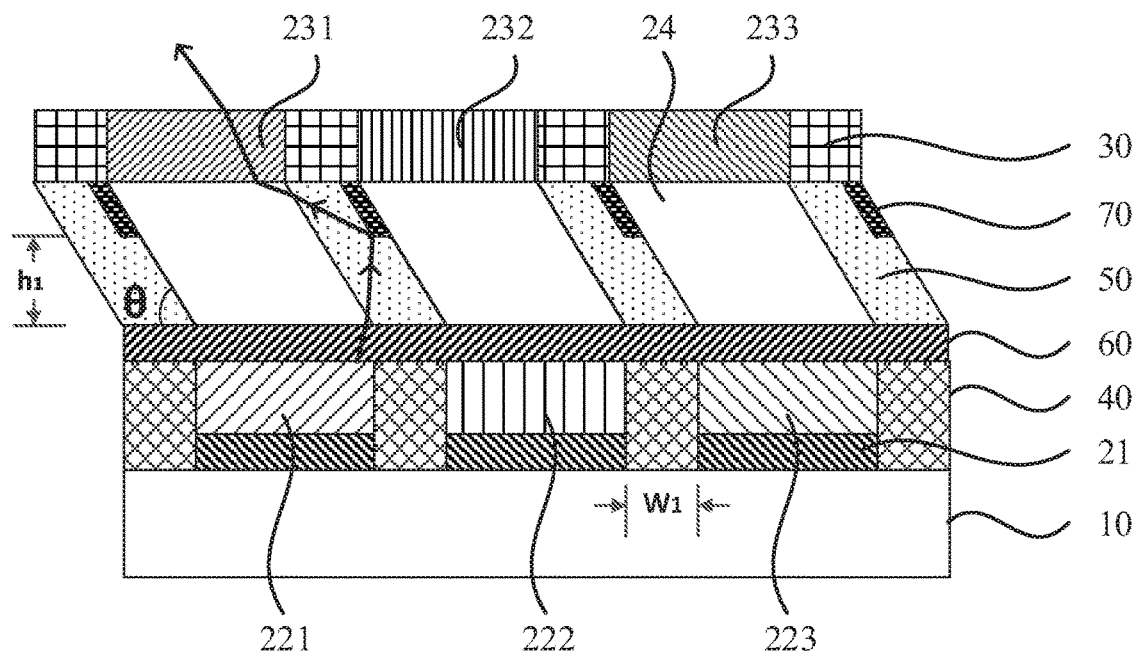
FIG. 6 is a structural diagram of another display panel according to an embodiment of the present disclosure.

FIG. 6 is a structural diagram of another display panel according to an embodiment of the present disclosure. Referring to FIG. 1 and FIG. 6, the display panel further includes a plurality of light-shielding interval structures 70, and the light-shielding interval structure 70 is disposed between the light-guiding medium structure 24 and the adjacent light-guiding interval structure 50. The second surface of the light-shielding interval stricture 70 is in contact with the black matrix 30, and the second surface of the light-shielding interval structure 70 is a surface facing away from the substrate 10. The extending direction of the light-shielding interval structure 70 is the same as that of the light guiding medium structure 24 or the light guiding interval structure 50. Along the extending direction of the light-shielding interval structure 70, the length of the light-shielding interval structure 70 is smaller than that of the light-guiding medium structure 24, When the light emitted from the edge of the light emitting unit 22 is propagated by the light guiding medium structure 24 to the light guiding interval structure 50, the light shielding interval structure 70 can block the light propagating to the light guiding interval structure 50 and prevent the light from being propagated to the color resist 23 of the adjacent pixel unit 20. Illustratively, when the light emitted from the edge of the red light emitting unit 221 is propagated by the light guiding medium structure 24 to the light guiding interval structure 50, the light shielding interval structure 70 can block the light propagating to the light guiding interval structure 50 and prevent the light from being propagated to the green color resist 232, thereby preventing the occurrence of color mixing. Here, the edge of the light emitting unit 22 refers to a portion of the light emitting unit 22 that is in contact with the pixel defining layer 40.

In one embodiment, referring to FIG. 6, the light-shielding interval structure 70 includes a metal material. The metal material has a good reflective effect, and the light propagating from the light guiding medium structure 24 into the light guiding spacer structure 50 can be reflected back into the light guiding medium structure 24 to continue propagating. Illustratively, referring to FIG. 6, When the light emitted from the edge of the red light emitting unit 221 is propagated by the light guiding medium structure 24 to the light guiding interval structure 50, the light-shielding interval structure 70 reflects the light back into the light guiding medium structure 24 to continue propagating, and finally exits from the red color resist 231, thereby preventing not only the occurrence of color mixing but also the luminous efficiency of the display panel.

Figure 7:
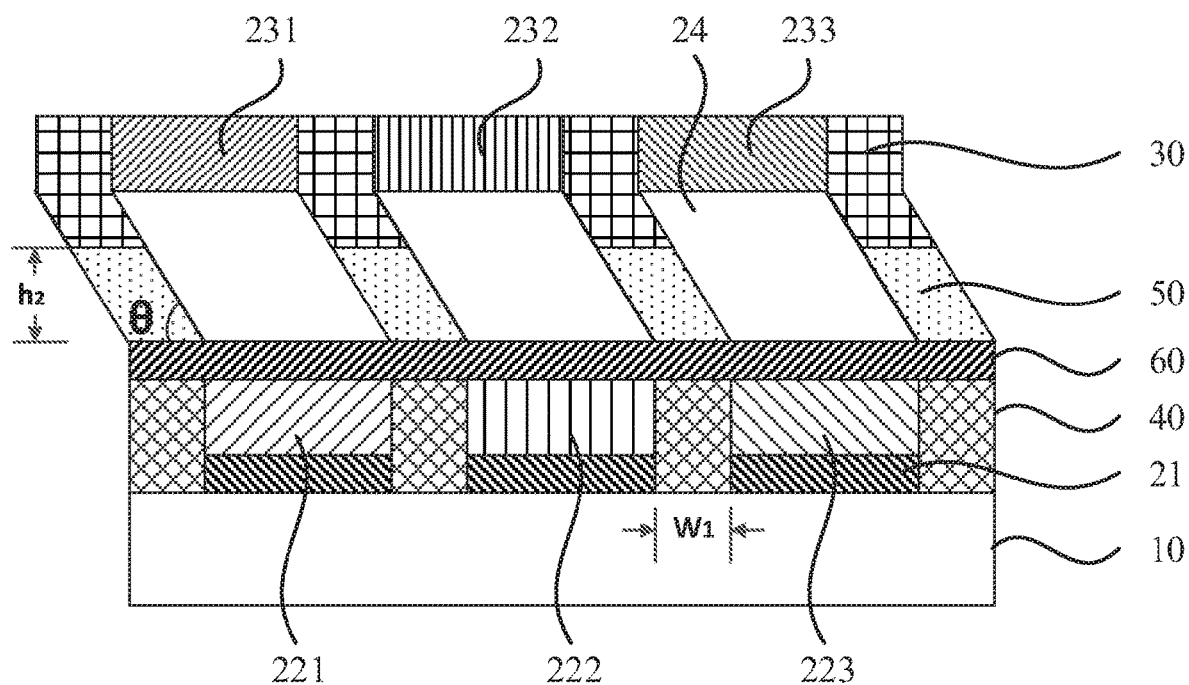
FIG. 7 is a structural diagram of another display panel according to an embodiment of the present disclosure.
Figure 8:
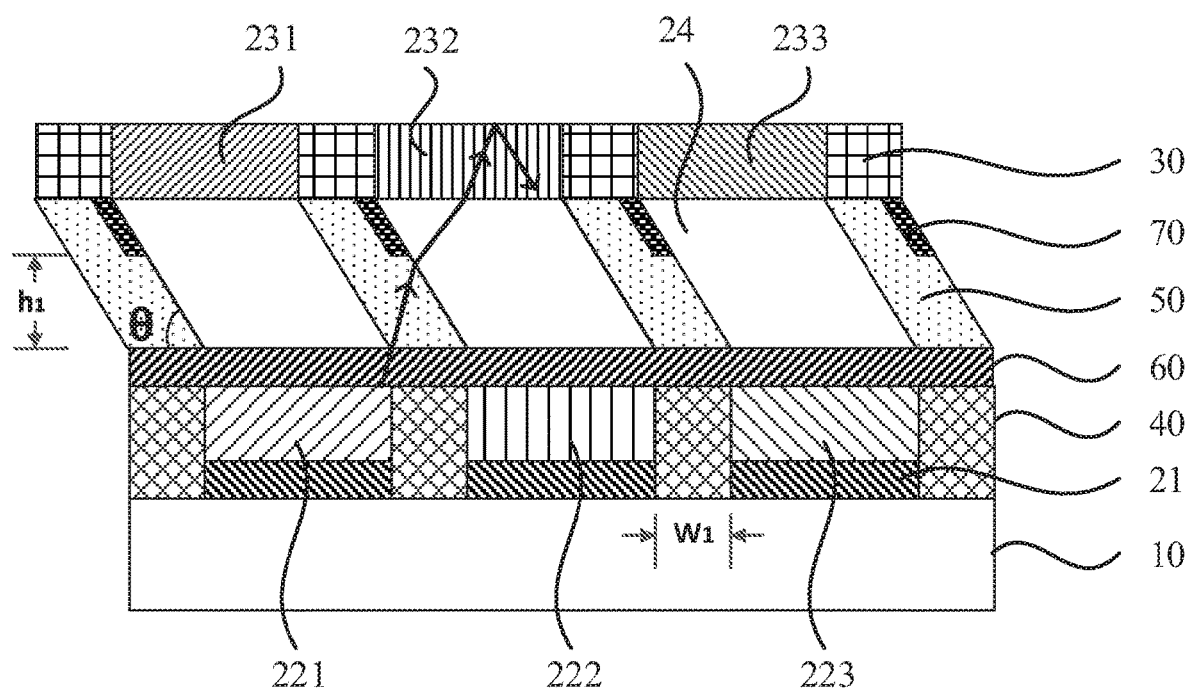
FIG. 8 is a schematic diagram showing light emitted from a pixel unit exiting through a color resist of an adjacent pixel unit.

FIG. 7 is a structural diagram of another display panel according to an embodiment of the present disclosure. Referring to FIG. 1 and FIG. 7, one surface of the black matrix 30 facing toward the substrate 10 extends to a location between adjacent light guiding medium structures 24. Along an extending direction of the light guiding medium structure 24, a length of a portion of the black matrix 30 extending to the location between the adjacent light guiding medium structures 24 is smaller than that of the light guiding medium structure 24. When the light emitted from the edge of the light emitting unit 22 is propagated by the light guiding medium structure 24 to the light guiding interval structure 50, the light shielding interval structure 30 can black the light propagating to the light guiding interval structure 50 and prevent the light from being propagated to the color resist 23 in the adjacent pixel unit 20, thereby preventing the occurrence of color mixing. In the embodiment of the present disclosure, since the occurrence of color mixing is prevented by using a portion of the black matrix 30 extending to the location between adjacent light guiding medium structures 24, that is, the black matrix 30 serves to prevent color mixing, compared to the related art, no new structures and processes have been added, FIG. 8 is a schematic diagram showing light emitted from a pixel unit exiting through a color resist of an adjacent pixel unit. referring to FIG. 1 and FIG. 8, a vertical distance between the second surface of the light-shielding interval structures and the first surface of the light guiding medium structure is $h_1$, which satisfies:

$$h_1 \leq \frac{w_1 \cdot \cos\left(\theta - \sin^{-1}\left(\frac{n_1}{n_2}\sin\left(\theta - \sin^{-1}\frac{1}{n_1}\right)\right)\right) \cdot \sin\theta}{\cos\left(\theta - \sin^{-1}\left(\frac{n_1}{n_2}\sin\left(\theta - \sin^{-1}\frac{1}{n_1}\right)\right)\right) - \sin\theta}.$$

Where $n_1$ denotes a refractive index of the light guiding medium structure, $n_2$ denotes a refractive index of the light guiding interval structure 50, $w_1$ denotes a distance between two adjacent light emitting units 22, and $\theta$ denotes an angle between an extending direction of the light guiding medium structure 24 and the substrate 10. When the light emitted from the edge of the light emitting unit 22 is propagated by the light guiding medium structure 24 to the light guiding interval structure 50, the light shielding interval structure 70 can block the light propagating to the light guiding interval structure 50 and prevent the light from being propagated to the color resist 23 in the adjacent pixel unit 20. The light that is not blocked by the light-shielding interval structure 70 cannot be emitted outside the display panel due to total reflection and be seen by the human eye. Illustratively, when the light emitted from the edge of the red light emitting unit 221 is propagated by the light guiding medium structure 24 to the light guiding interval structure 50, light that is not blocked by the light-shielding interval structure 70 is irradiated onto the green color resist 232, and when $h_1$ satisfies:

$$h_1 \leq \frac{w_1 \cdot \cos\left(\theta - \sin^{-1}\left(\frac{n_1}{n_2}\sin\left(\theta - \sin^{-1}\frac{1}{n_1}\right)\right)\right) \cdot \sin\theta}{\cos\left(\theta - \sin^{-1}\left(\frac{n_1}{n_2}\sin\left(\theta - \sin^{-1}\frac{1}{n_1}\right)\right)\right) - \sin\theta},$$

total reflection occurs on the surface of one surface of the green color resist 232 that is facing away from the substrate 10, and the light cannot be emitted outside the display panel and be seen by human eyes.

Figure 9:
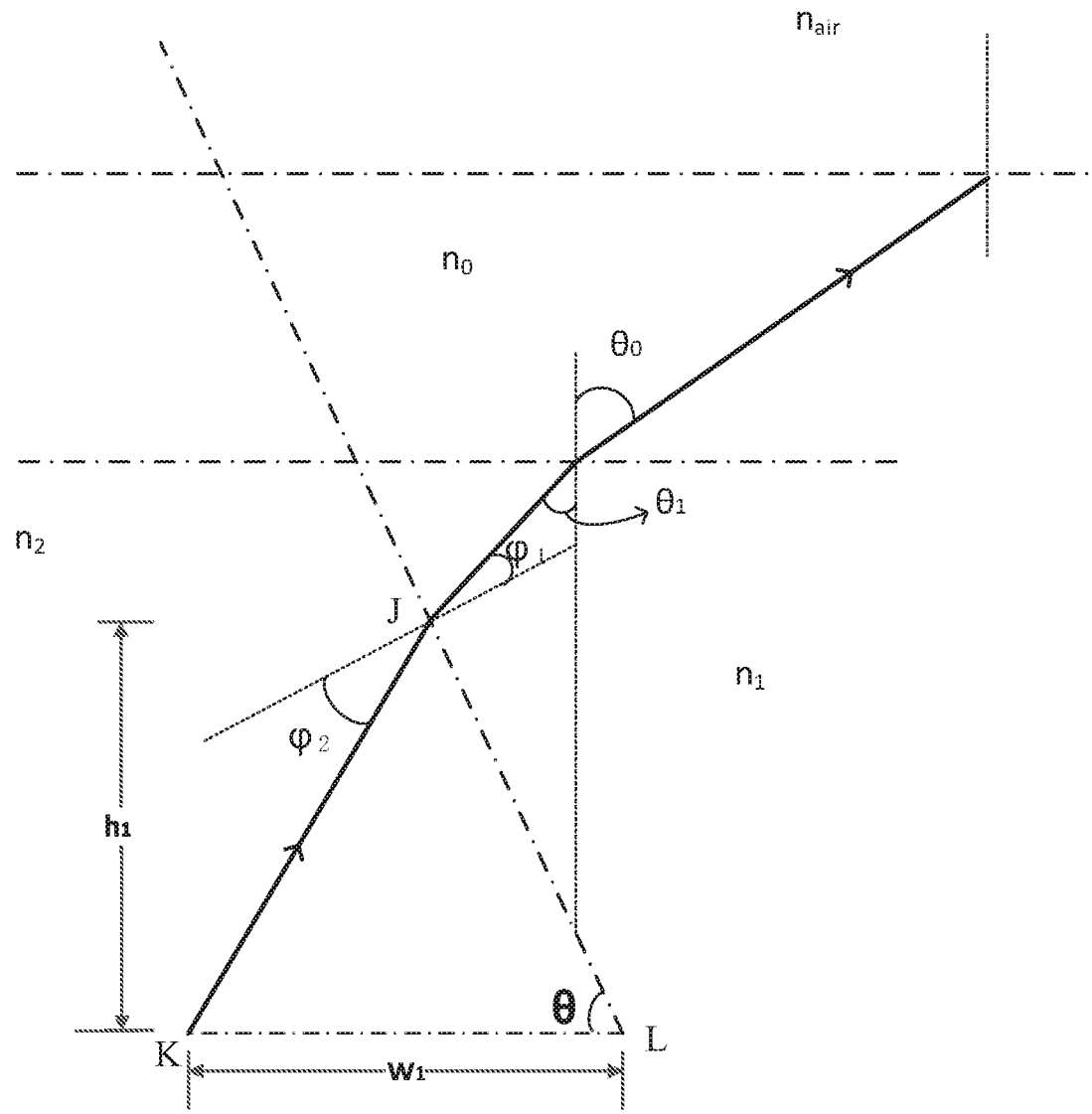
FIG. 9 is a simplified schematic diagram showing the total reflection of light emitted from the light-emitting unit in FIG. 8 on the surface of a color resist in an adjacent pixel unit.

FIG. 9 is a simplified schematic diagram showing the total reflection of light emitted from the light-emitting unit in FIG. 8 on the surface of a color resist in an adjacent pixel unit. Referring to FIG. 1, FIG. 8 and FIG. 9, for the sake of clarity, the various points are also marked in FIG. 9. As can be seen from FIG. 9: $n_1 \sin\theta_1 = n_0 \sin\theta_0 = n_{air} \sin\theta_{air}$.

Here, $n_0$ denotes a refractive index of the intermediate film layer, for example, $n_0$ may denote the refractive index of the color resist 23. Since the total reflection process occurring on the surface of the color resist 23 facing away from the substrate 10 is independent of the refractive index of the intermediate film layer, thus $n_0$ can denote the refractive index of the red color resist 231, the refractive index of the green color resist 232, or the refractive index of the blue color resist 233. $n_{air}$ denotes the refractive index of air, and $n_{air}=1$.

When the total reflection occurs on the surface of the color resist 23 facing away from of the substrate 10, it is required to satisfy: $n_1 \sin\theta_1 \geq 1$.

Thus, $$\varphi_1 = \theta - \theta_1 \leq \theta - \sin^{-1}\frac{1}{n_1}.$$

According to $n_1 \sin\varphi_1 = n_2 \sin\varphi_2$, thus, $$\varphi_2 \leq \sin^{-1}\left(\frac{n_1}{n_2}\sin\left(\theta - \sin^{-1}\frac{1}{n_1}\right)\right).$$

Further, according to the angle $\theta$ and the surface length $w_1$ in the triangle JKL, it is obtained:

$$h_1 \leq \frac{w_1 \cdot \cos\left(\theta - \sin^{-1}\left(\frac{n_1}{n_2}\sin\left(\theta - \sin^{-1}\frac{1}{n_1}\right)\right)\right) \cdot \sin\theta}{\cos\left(\theta - \sin^{-1}\left(\frac{n_1}{n_2}\sin\left(\theta - \sin^{-1}\frac{1}{n_1}\right)\right)\right) - \sin\theta}$$

Optionally, referring to FIG. 1 and FIG. 7, a vertical distance between the surface of the black matrix 30 facing to the substrate 10 and a first surface of the light guiding medium structure 24 is $h_2$, which satisfies:

$$h_2 \leq \frac{w_1 \cdot \cos\left(\theta - \sin^{-1}\left(\frac{n_1}{n_2}\sin\left(\theta - \sin^{-1}\frac{1}{n_1}\right)\right)\right) \cdot \sin\theta}{\cos\left(\theta - \sin^{-1}\left(\frac{n_1}{n_2}\sin\left(\theta - \sin^{-1}\frac{1}{n_1}\right)\right)\right) - \sin\theta}.$$

Here, $n_1$ denotes a refractive index of the light guiding medium structure 24 and $n_2$ denotes a refractive index of the light guiding interval structure 50. $w_1$ denotes the distance between two adjacent light emitting units 22 and $\theta$ denotes an angle between the extending direction of the light guiding medium structure 24 and the substrate 10. When the light emitted from the edge of the light emitting unit 22 is propagated by the light guiding medium structure 24 to the light guiding interval structure 50, the tight shielding interval structure 30 can block the light propagating to the light guiding interval structure 50 and prevent the light from being propagated to the color resist 23 in the adjacent pixel unit 20. Light that is not blocked by the portion of the black matrix 30 extending to a location between adjacent light guiding medium structures 24 cannot be emitted outside the display panel due to the total reflection and be seen by human eyes. The derivation of the formula satisfying $h_2$ is similar to that of the formula satisfying $h_1$, details are not described herein again.

In some embodiments, optionally, the filler may not be solid, that is, a gas is used instead of using the tight-guiding interval structure 50. The gas may be, for example, an inert gas such as nitrogen or helium. The refractive index of the gas is smaller than that of the light guiding medium structure 24. When an incident angle of incident light exceeds a certain angle, the incident tight can be propagated in the tight guiding medium structure 24 due to total reflection.

When the incident angle of incident light is less than or equal to the certain angular range, the incident tight can be propagated into the gap between adjacent light guiding medium structures 24 from the light guiding medium structure 24 because no total reflection occurs.

Figure 10:
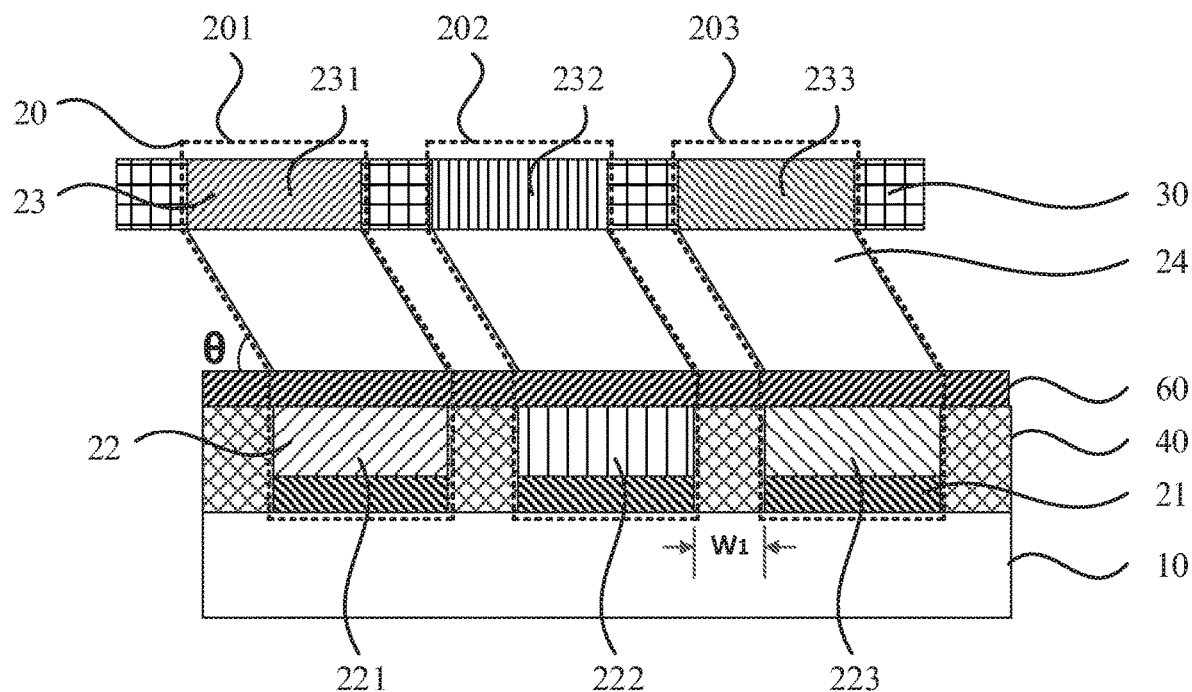
FIG. 10 is a structural diagram of another display panel according to an embodiment of the present disclosure.
Figure 11:
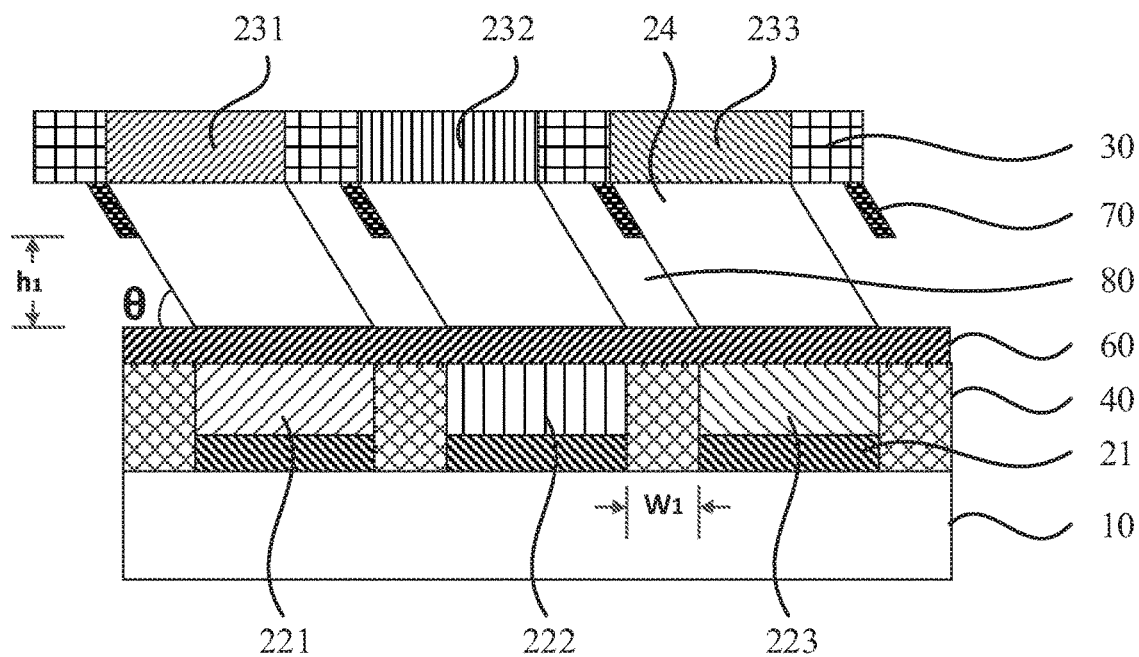
FIG. 11 is a structural diagram of another display panel according to an embodiment of the present disclosure.
Figure 12:
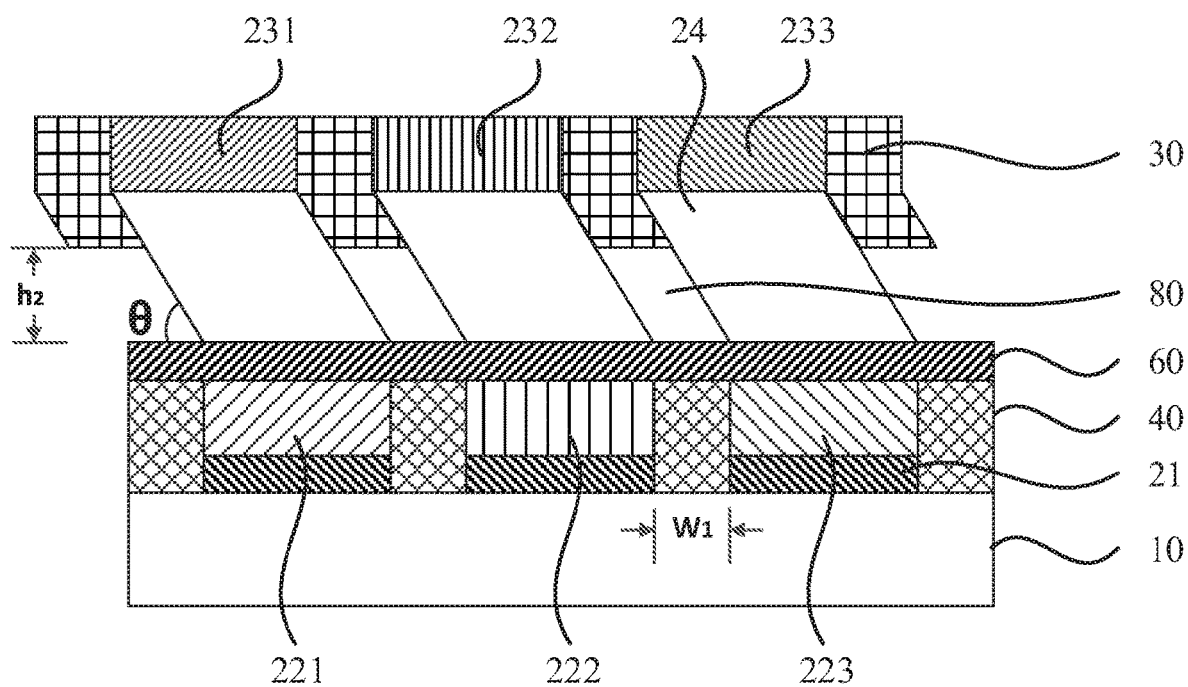
FIG. 12 is a structural diagram of another display panel according to an embodiment of the present disclosure.

FIG. 10 is a schematic structural diagram of another display panel according to an embodiment of the present disclosure, FIG. 11 is a schematic structural diagram of another display panel according to an embodiment of the present disclosure, and FIG. 12 is another display panel according to an embodiment of the present disclosure. FIG. 10, FIG. 11, and FIG. 12 correspond to FIG. 1, FIG. 6, and FIG. 7, respectively. The difference lies in that the light guiding interval structure 50 is not provided in FIG. 10, FIG. 11, and FIG. 12, and the filler in the gap of the adjacent optical medium structure 24 is gas. It should be understood that, the formula satisfied by $\theta$, $h_1$ and $h_2$ is also applicable to the display panel structure shown in FIG. 10 to FIG. 12, and it is only necessary to replace the refractive index $n_2$ of the light guiding interval structure 50 with the refractive index $n_3$ of the gas filter. That is, $$\sin^{-1}\frac{n_3}{n_1} \leq \theta \leq \frac{1}{3}\left(\sin^{-1}\frac{n_3}{n_1} + 180°\right),$$

$$h_1 \leq \frac{w_1 \cdot \cos\left(\theta - \sin^{-1}\left(\frac{n_1}{n_3}\sin\left(\theta - \sin^{-1}\frac{1}{n_1}\right)\right)\right) \cdot \sin\theta}{\cos\left(\theta - \sin^{-1}\left(\frac{n_1}{n_3}\sin\left(\theta - \sin^{-1}\frac{1}{n_1}\right)\right)\right) - \sin\theta} \text{ and}$$

$$h_2 \leq \frac{w_1 \cdot \cos\left(\theta - \sin^{-1}\left(\frac{n_1}{n_2}\sin\left(\theta - \sin^{-1}\frac{1}{n_1}\right)\right)\right) \cdot \sin\theta}{\cos\left(\theta - \sin^{-1}\left(\frac{n_1}{n_2}\sin\left(\theta - \sin^{-1}\frac{1}{n_1}\right)\right)\right) - \sin\theta}.$$

Figure 13:
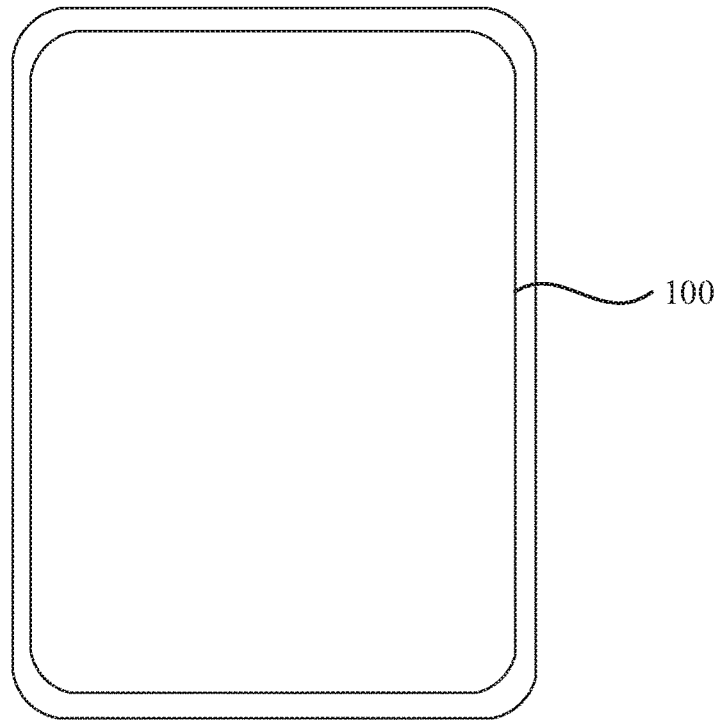
FIG. 13 is a structural diagram of a display device according to an embodiment of the present disclosure.

An embodiment of the present disclosure further provides a display device. FIG. 13 is a schematic structural diagram of a display device according to an embodiment of the present disclosure, Referring to FIG. 13, the display device includes any display panel 100 provided by an embodiment of the present disclosure. The display device may be a mobile phone, a tablet PC, an intelligent wearable device, etc.

It should be noted that the above are only preferred embodiments of the present disclosure and the technical principles used therein. It will be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A display panel, comprising:
    a substrate; and
    pixel units provided on the substrate, wherein the pixel units of at least two different colors are adjacently arranged;
    wherein in a direction facing away from the substrate, one of the pixel units comprises a reflective electrode, a light emitting unit and a color resist, wherein the light emitting unit and the color resist disposed in a same pixel unit have a same color, and a vertical projection of a geometric center of the light emitting unit on the substrate is not overlapped with that of a geometric center of the color resist in the same pixel unit on the substrate;

wherein a vertical projection of the color resist in the one of the pixel units on the substrate is overlapped with that of the light emitting unit in a pixel unit adjacent to the one of the pixel units on the substrate, wherein the one of the pixel units further comprises a light guiding medium structure disposed between the light emitting unit and the color resist, a gap exists between adjacent light guiding medium structures, and a refractive index of a filler in the gap is smaller than that of the light guiding medium structure.

2. The display panel of claim 1, wherein a vertical projection of a first surface of the light guiding medium structure on the substrate is overlapped with that of the light emitting unit closest to the first surface of the light guiding medium structure on the substrate, wherein a vertical projection of a second surface of the light guiding medium structure on the substrate is overlapped with that of the color resist closest to the second surface of the light guiding medium structure on the substrate, wherein the first surface of the light guiding medium structure is a surface closer to the substrate than the second surface of the light guiding medium structure, and the second surface of the light guiding medium structure is a surface of the light guiding medium structure facing away from the substrate.

3. The display panel of claim 1, wherein a black matrix is disposed between two adjacent color resist, and a pixel defining layer is disposed between adjacent light emitting units;

wherein the display panel further comprises a plurality of light guiding interval structures, wherein each of the light guiding interval structures is disposed between the pixel defining layer and the black matrix, and each of the light guiding interval structures is disposed between the adjacent light guiding medium structures and fills the gap;

wherein the refractive index of the each of the light guiding interval structures is smaller than that of the light guiding medium structure.

4. The display panel of claim 3, wherein a vertical projection of a first surface of one of the light guiding interval structures on the substrate is overlapped with that of the pixel defining layer closest to the first surface of the one of the light guiding interval structures on the substrate, wherein a vertical projection of a second surface of the one of the light guiding interval structures on the substrate is overlapped with that of the black matrix closest to the second surface of the one of the light guiding interval structures on the substrate, wherein the first surface of the one of the light guiding interval structures is the surface closer to the substrate than the second surface of the one of the light guiding interval structures, and the second surface of the one of the light guiding interval structures is the surface facing away from the substrate.

5. The display panel of claim wherein
the display panel further comprises a plurality of light-shielding interval structures, wherein each of the light-shielding interval structures is disposed between the light guiding medium structure and an adjacent light guiding interval structure, a second surface of one of the light-shielding interval structures is in contact with the black matrix, and a second surface of the one of the light-shielding interval structures is the surface facing away from the substrate;

wherein an extending direction of the one of the light-shielding interval structures is the same as that of the light guiding medium structure or the light guiding interval structures, wherein along the extending direction of the one of the light-shielding interval structures, a length of the one of the light-shielding interval structures is smaller than that of the light guiding medium structure.

6. The display panel of claim 5, wherein each of the light-shielding interval structures comprises a metal material.

7. The display panel of claim 3, Wherein one surface of the black matrix facing to the substrate extends to a location between the adjacent light guiding medium structures;

wherein along an extending direction of the light guiding medium structure, a length of a portion of the black matrix extending to the location between the adjacent light guiding medium structures is smaller than that of the light guiding medium structure.

8. The display panel of claim 1, wherein the filler is gas.

9. The display panel of claim 3, wherein an angle between an extending direction of the light guiding medium structure and the substrate is θ, which satisfies:

$$\sin^{-1}\frac{n_2}{n_1} \le \theta \le \frac{1}{3}\left(\sin^{-1}\frac{n_2}{n_1} + 180°\right),$$

wherein $n_1$ denotes a refractive index of the light guiding medium structure and $n_2$ denotes a refractive index of the one of the light guiding interval structures.

10. The display panel of claim 5, wherein a vertical distance between the second surface of the light-shielding interval structures and the first surface of the light guiding medium structure is $h_1$, which satisfies:

$$h_1 \le \frac{w_1 \cdot \cos\left(\theta - \sin^{-1}\left(\frac{n_1}{n_2}\sin\left(\theta - \sin^{-1}\frac{1}{n_1}\right)\right)\right) \cdot \sin\theta}{\cos\left(\theta - \sin^{-1}\left(\frac{n_1}{n_2}\sin\left(\theta - \sin^{-1}\frac{1}{n_1}\right)\right)\right) - \sin\theta};$$

wherein $n_1$ denotes a refractive index of the light guiding medium structure, $n_2$ denotes a refractive index of the one of the light guiding interval structures, $w_1$ denotes a distance between two adjacent light emitting units, and θ denotes an angle between an extending direction of the light guiding medium structure and the substrate.

11. The display panel of claim 7, wherein a vertical distance between the surface of the black matrix facing to the substrate and a first surface of the light guiding medium structure is $h_2$, which satisfies:

$$h_2 \le \frac{w_1 \cdot \cos\left(\theta - \sin^{-1}\left(\frac{n_1}{n_2}\sin\left(\theta - \sin^{-1}\frac{1}{n_1}\right)\right)\right) \cdot \sin\theta}{\cos\left(\theta - \sin^{-1}\left(\frac{n_1}{n_2}\sin\left(\theta - \sin^{-1}\frac{1}{n_1}\right)\right)\right) - \sin\theta};$$

wherein $n_1$ denotes a refractive index of the light guiding medium structure, $n_2$ denotes a refractive index of the light guiding interval structure, $w_1$ denotes a distance between two adjacent light emitting units, and θ denotes an angle between an extending direction of the light guiding medium structure and the substrate.

12. The display panel of claim 9, wherein for the light emitting unit and the color resist in the same pixel unit, a vertical projection of the light emitting unit on the substrate is overlapped with that of the color resist on the substrate;

wherein a vertical distance between the surface of the light guiding medium structure facing away from the substrate and a surface of the light guiding medium structure closest to the substrate is $h_3$, which satisfies: $h_3 = w_2 \cdot \tan \theta$;

wherein $w_2$ denotes a width of the light emitting unit, $\theta$ denotes an angle between the extending direction of the light guiding medium structure and the substrate.

13. A display device, comprising a display panel, wherein the display panel comprises:

a substrate; and pixel units provided on the substrate, wherein the pixel units of at least two different colors are adjacently arranged;

wherein in a direction facing away from the substrate, one of the pixel units comprises a reflective electrode, a light emitting unit and a color resist, wherein the light emitting unit and the color resist disposed in a same pixel unit have a same color, and a vertical projection of a geometric center of the light emitting unit on the substrate is not overlapped with that of a geometric center of the color resist in the same pixel unit on the substrate;

wherein a vertical projection of the color resist in the one of the pixel units on the substrate is overlapped with that of the light emitting unit in a pixel unit adjacent to the one of the pixel units on the substrate, wherein the one of the pixel units further comprises a light guiding medium structure disposed between the light emitting unit and the color resist, a gap exists between adjacent light guiding medium structures, and a refractive index of a filler in the gap is smaller than that of the light guiding medium structure.

* * * * *